(12) United States Patent
Adachi et al.

(10) Patent No.: US 7,333,147 B2
(45) Date of Patent: Feb. 19, 2008

(54) IMAGE PICKUP DEVICE WITH A THREE-DIMENSIONAL CIRCUIT BOARD AND DEVICE ASSEMBLY METHOD

(75) Inventors: Yoshio Adachi, Yokosuka (JP); Sadashi Sasaki, Yokohama (JP); Tamotsu Kaneko, Zama (JP); Fumikazu Harazono, Sagamihara (JP); Tatsuo Kobayashi, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 617 days.

(21) Appl. No.: 10/169,359

(22) PCT Filed: Feb. 26, 2001

(86) PCT No.: PCT/JP01/01415

§ 371 (c)(1),
(2), (4) Date: May 20, 2004

(87) PCT Pub. No.: WO01/65836

PCT Pub. Date: Sep. 7, 2001

(65) Prior Publication Data

US 2005/0270403 A1 Dec. 8, 2005

(30) Foreign Application Priority Data

Feb. 29, 2000 (JP) ............................ 2000-053400

(51) Int. Cl.
*H04N 5/225* (2006.01)
*H01L 27/00* (2006.01)

(52) U.S. Cl. ..................... 348/374; 348/340; 250/208.1

(58) Field of Classification Search ................ 348/294, 348/340, 373, 374, 376; 250/208.1
See application file for complete search history.

(56) References Cited

U.S. PATENT DOCUMENTS

| 6,476,417 | B2 * | 11/2002 | Honda et al. ............. 257/59 |
| 6,762,796 | B1 * | 7/2004 | Nakajoh et al. ............. 348/340 |
| 6,795,120 | B2 * | 9/2004 | Takagi et al. ............. 348/294 |
| 7,026,548 | B2 * | 4/2006 | Bolken et al. ............. 257/693 |
| 7,122,787 | B2 * | 10/2006 | Nishizawa ............. 348/374 |
| 7,253,388 | B2 * | 8/2007 | Kuhmann et al. ......... 250/208.1 |

(Continued)

FOREIGN PATENT DOCUMENTS

EP  0 773 673  5/1997

(Continued)

OTHER PUBLICATIONS

Segawa et al. "A Micro Miniaturized CCD Color Camera Utilizing A Newly Developed CCD Packaging Technique"; Aug. 1995; IEEE Transactions on Consumer Electronics; vol. 41, No. 3, pp. 946-953.*

(Continued)

*Primary Examiner*—John M. Villecco
(74) *Attorney, Agent, or Firm*—Pearne & Gordon LLP

(57) ABSTRACT

The invention integrally arranges a lens, an optical filter, a semiconductor imaging device, on-chip components, and a printed circuit board on a three-dimensional circuit board and contrives the lens attachment structure, bonding method, color of an adhesive, masking of the lens, etc. in order to implement a structure that allows high performance, compact, lightweight and rigid design, and mass production, as well as a high-quality picture.

17 Claims, 13 Drawing Sheets

U.S. PATENT DOCUMENTS

| | | | |
|---|---|---|---|
| 7,262,405 B2 * | 8/2007 | Farnworth et al. | 348/374 |
| 7,282,693 B2 * | 10/2007 | Onodera et al. | 250/208.1 |
| 2001/0030276 A1 * | 10/2001 | Hoshino | 250/208.1 |
| 2002/0163589 A1 * | 11/2002 | Yukawa et al. | 348/374 |
| 2003/0094665 A1 * | 5/2003 | Harazono | 257/432 |
| 2004/0056971 A1 * | 3/2004 | Yang et al. | 348/294 |
| 2004/0150740 A1 * | 8/2004 | Hsin | 348/340 |
| 2005/0264676 A1 * | 12/2005 | Nagano | 348/340 |
| 2006/0016973 A1 * | 1/2006 | Yang et al. | 250/239 |

FOREIGN PATENT DOCUMENTS

| | | | |
|---|---|---|---|
| JP | 61032017 A * | 2/1986 | |
| JP | 63-43353 | 2/1988 | |
| JP | 3-12124 | 1/1991 | |
| JP | 3-72789 | 3/1991 | |
| JP | 05-176208 | 7/1993 | |
| JP | 07272302 A * | 10/1995 | |
| JP | 10-10394 | 1/1998 | |
| JP | 11191865 A * | 7/1999 | |
| JP | 11-14878 | 11/1999 | |
| JP | 11-341365 | 12/1999 | |
| JP | 11-345769 | 12/1999 | |
| JP | 11-354769 | 12/1999 | |
| JP | 11341366 A * | 12/1999 | |
| JP | 2000058805 A * | 2/2000 | |
| JP | 2005-176208 | 6/2005 | |

OTHER PUBLICATIONS

Official Translation of Japanese Publ. No. 11-354769 A.*

* cited by examiner

IMAGE PICKUP DEVICE WITH A THREE-DIMENSIONAL CIRCUIT BOARD AND DEVICE ASSEMBLY METHOD

TECHNICAL FIELD

The present invention relates to imaging apparatus such as a monitoring camera, a camera for medical use and a vehicle-mounted camera downsized using a semiconductor-imaging device.

BACKGROUND OF THE INVENTION

Conventionally, concerning imaging apparatus of this type, as the semiconductor imaging device to convert a picture shot by lenses to an electric signal has become smaller and high-performance, the camera has become compact and has been used in various applications thus enhancing the society's convenience. Smaller cameras have widely used in the market of a camera as a picture input sensor.

The imaging apparatus that uses a conventional. semiconductor device has combined components such as a lens, a semiconductor-imaging device and an LSI into case or a structure respectively. The printed circuit board of the apparatus has a form of a plane on which components necessary for driving the semiconductor-imaging device are mounted.

However, in the method for assembling conventional cameras, reduction of the size of the camera is limited as long as the components are connected to each other even when the semiconductor-imaging device is downsized, that is, an expertise is required for assembling or an automatic machine cannot be used for the assembling procedure.

The present invention solves the above problems and provides imaging apparatus that allows further downsizing and assembling using an automatic machine and its assembling method.

DISCLOSURE OF THE INVENTION

Imaging apparatus of the invention has a semiconductor imaging device on the surface and comprises a three-dimensional printed circuit board above the semiconductor imaging device. With this configuration, all the components necessary for the imaging apparatus can be integrated on a three-dimensional printed circuit board for downsizing.

Imaging apparatus of the invention comprises a three-dimensional circuit board having a leg and a cylindrical barrel provided on the leg, a semiconductor imaging device attached on the back of the leg and a lens, supported inside the barrel, to impinge a light onto the semiconductor imaging device. With this configuration, dislocation on the optical axis between the semiconductor device and the lens is reduced.

Imaging apparatus of the invention is characterized in that the three-dimensional circuit board includes a barrel of a bottomed cylinder shape supporting the lens, a leg connected to the barrel, inside of which is formed the wiring pattern and an opening formed at the boundary between the barrel and the leg, that the optical filter is arranged above the opening of the three-dimensional circuit board, and that the semiconductor imaging device and the on-chip components are arranged below the opening. With this configuration, it is possible to do without a supporting component or joint assembly dedicated to a lens, an optical filter, a semiconductor imaging device, an LSI, on-chip components, etc. that constitute imaging apparatus and downsize the imaging apparatus by integrating all of such components on a three-dimensional circuit board. It is also possible to reduce the length between the LSI that drives the semiconductor imaging device and peripheral components thereby preventing the distortion of a clock signal and unwanted radiation.

Imaging apparatus of the invention is characterized in that the three-dimensional circuit board comprises a recessed shoulder where a wiring pattern is formed inside of the leg and that on the recessed shoulder is arranged a printed circuit board with an LSI and on-chip components joined on one surface or both surfaces. With this configuration, it is possible to add further features to the imaging apparatus.

Imaging apparatus of the invention is characterized in that the three-dimensional circuit board has a wiring pattern for directly providing an electric connection between the three-dimensional circuit board and another printed circuit board on the bottom of the leg. With this configuration, it is possible to directly attach an assembled three-dimensional circuit board to the main printed circuit board of a portable telephone set, a PC or various sensors. This implements a compact imaging system and a lightweight structure owing to elimination of a connector, etc.

Imaging apparatus of the invention is characterized in that the three-dimensional circuit board comprises a plurality of adhesive injection grooves for injecting an adhesive on the upper area of the inner circumference of the barrel. With this configuration, by instilling an adhesive using a jug having the shape of a dropping pipet into the adhesive injection grooves, it is possible to uniformly permeate an adhesive onto the periphery of the lens in order to readily fix the lens on the three-dimensional circuit board.

Imaging apparatus of the invention is characterized in that the inner circumference of the barrel of the three-dimensional circuit board is formed while tapering downward adjacent to the adhesive injection grooves. With this configuration, it is possible to uniformly permeate an adhesive onto the periphery of the lens on the inner circumference of the barrel to assure precise bonding. It is also possible to provide a structure whereby a lens is easily inserted into a three-dimensional circuit board by using an automatic machine from above or when a three-dimensional circuit board is elevated from beneath to attach the three-dimensional circuit board to the lens in fixed position.

Imaging apparatus of the invention is characterized in that the adhesive is black. With this configuration, it is possible to absorb with black color of the adhesive an irregular light inside the lens reaching the lens side thus preventing reflection of the light on the lens side. It is thus possible to prevent a light in the direction of the optical axis caused by the poor surface accuracy of the lens or dust on the lens from generating optical interference inside the lens or from reaching the semiconductor imaging device thus degrading the quality of the picture obtained.

Imaging apparatus of the invention is characterized in that in the lower area of the barrel of the three-dimensional circuit board is provided an adhesive reservoir. With this configuration, it is possible to prevent an adhesive from seeping through the bonding site of the lens to cause internal contamination when an adhesive is injected in excess or is less viscous.

Imaging apparatus of the invention is characterized in that the sections other than the effective section of the lens on the front of the lens are masked. With this configuration, it is possible to prevent an incident light from a section other than the effective section of the lens thus preventing distortion of a picture or degrading of picture quality caused by irregular reflection.

Imaging apparatus of the invention is characterized in that the an optical filter is omitted from the foregoing configuration. With this configuration, it is possible to provide imaging apparatus fit for a specific purpose of use, that is, imaging apparatus that is sensitive enough to detect in the nighttime the basic signal Y of a picture alone, or a sensor that can extract a video signal in the infrared region.

A imaging apparatus assembling method of the invention is characterized in that, with respect to a three-dimensional circuit board having a barrel of a bottomed cylinder shape, a leg connected to the barrel, inside of which is formed a wiring pattern and an opening formed at the boundary between the barrel and the leg, the method comprises a step of joining a lens with the inner circumference of the barrel, a step of joining a semiconductor imaging device with the wiring pattern so as to block the opening from the back of the leg, and a step of joining on-chip components with the wiring pattern. With this method, it is possible to separate the manufacturing process by performing bonding of components to be assembled from above the three-dimensional circuit board and by performing electric connection of components from beneath the three-dimensional circuit board by way of soldering, a conductive adhesive, or ultra sound joint, there by assuring efficient manufacturing that allows easy assembly using an automatic machine.

A imaging apparatus assembling method of the invention is characterized in that, with respect to a three-dimensional circuit board having a barrel of a bottomed cylinder shape, a leg connected to the barrel, inside of which is formed a wiring pattern and an opening formed at the boundary between the barrel and the leg, the method comprises a step of joining a lens with the inner circumference of the barrel, a step of joining a semiconductor imaging device with the wiring pattern so as to block the opening from the back of the leg, a step of joining on-chip components with the wiring pattern, and a step of joining with the recessed shoulder a printed circuit board with an LSI and on-chip components joined in advance on one surface or both surfaces. With this method, it is possible to separate the manufacturing process by performing bonding of components to be assembled from above the three-dimensional circuit board and by performing electric connection of components from beneath the three-dimensional circuit board by way of soldering, a conductive adhesive, or ultrasound joint, thereby assuring efficient manufacturing that allows easy assembly using an automatic machine.

A imaging apparatus assembling method of the invention is characterized in that, with respect to a three-dimensional circuit board having a barrel of a bottomed cylinder shape, a leg connected to the barrel, inside of which is formed a wiring pattern and an opening formed at the boundary between the barrel and the leg, the method comprises a step of joining an optical filter so as to block the opening from the barrel side, a step of joining a lens with the inner circumference of the barrel, a step of joining a semiconductor imaging device with the wiring pattern so as to block the opening from the back of the leg, and a step of joining on-chip components with the wiring pattern. With this method, it is possible to separate the manufacturing process by performing bonding of components to be assembled from above the three-dimensional circuit board and by performing electric connection of components from beneath the three-dimensional circuit board by way of soldering, a conductive adhesive, or ultrasound joint, thereby assuring efficient manufacturing that allows easy assembly using an automatic machine.

A imaging apparatus assembling method of the invention is characterized in that, with respect to a three-dimensional circuit board having a barrel of a bottomed cylinder shape, a leg connected to the barrel, inside of which is formed a wiring pattern and an opening formed at the boundary between the barrel and the leg, the method comprises a step of joining an optical filter so as to block the opening from the barrel side, a step of joining a lens with the inner circumference of the barrel, a step of joining a semiconductor imaging device with the wiring pattern so as to block the opening from the back of the leg, a step of joining on-chip components with the wiring pattern, and a step of joining with the recessed shoulder a printed circuit board with an LSI and on-chip components joined in advance on one surface or both surfaces. With this method, it is possible to separate the manufacturing process by performing bonding of components to be assembled from above the three-dimensional circuit board and by performing electric connection of components from beneath the three-dimensional circuit board by way of soldering, a conductive adhesive, or ultrasound joint, thereby assuring efficient manufacturing that allows easy assembly using an automatic machine.

A imaging apparatus assembling method of the invention is characterized in that the method comprises a step of joining an assembled three-dimensional circuit board to another printed circuit board via a wiring pattern formed on the bottom of its leg. With this method, it is possible to directly attach a three-dimensional circuit board mounting a lens, an optical filter, a semiconductor imaging device, an LSI, on-chip components, etc. to the main printed circuit board of a portable telephone set, a PC or various sensors.

Figure 1:
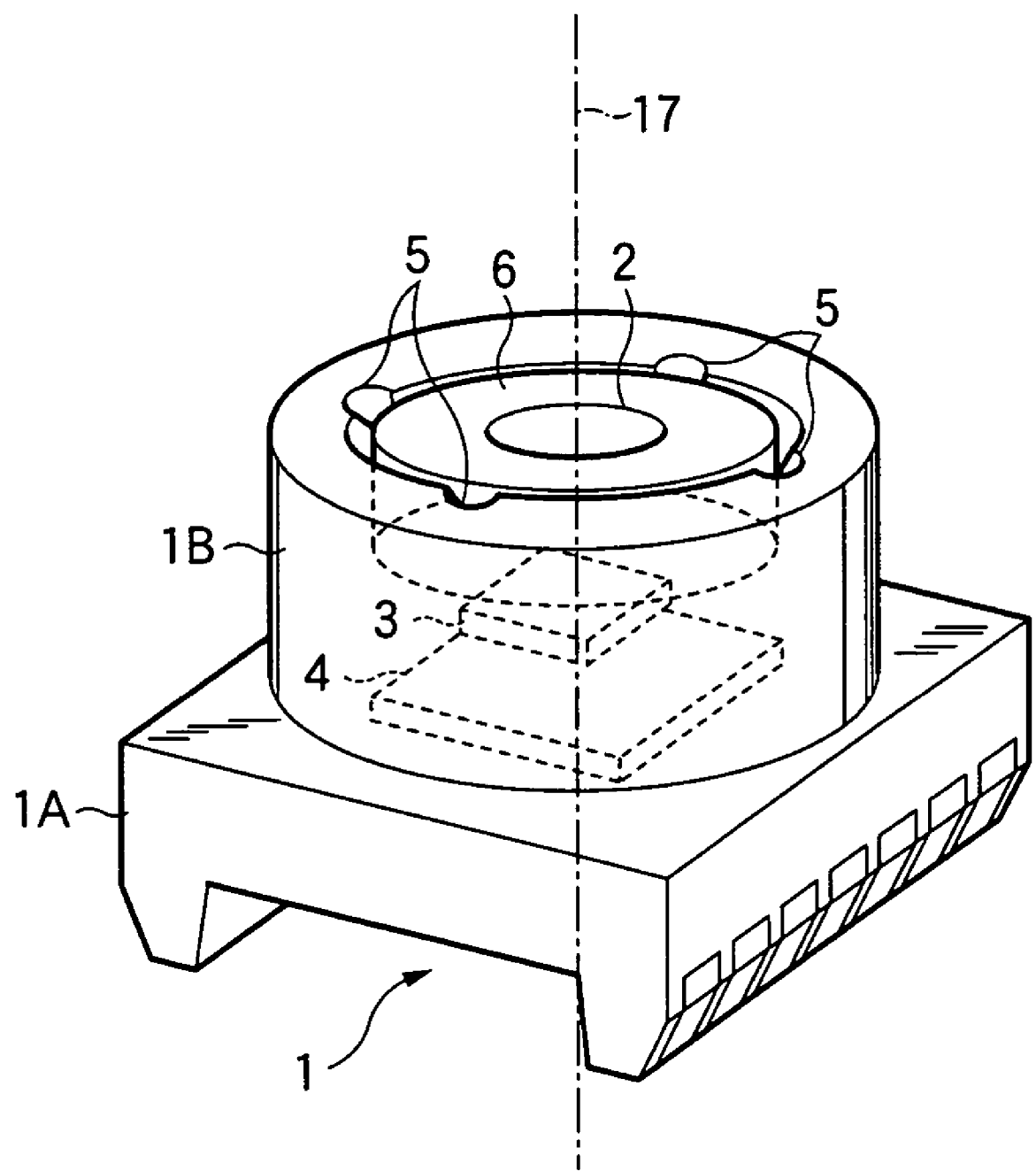
FIG. 1 is a perspective view of imaging apparatus in Embodiment 1 of the invention.

In the figures, a numeral 1 represents a three-dimensional circuit board, 1A a leg, 1B a barrel, 1C an opening, 1D a recessed shoulder, 2 a lens, 3 an optical filter, 4 a semiconductor imaging device, 5 bonding points (adhesive injection grooves), 6 a lens mask, 7 an adhesive reservoir, 8 on-chip components, 9 an adhesive, 10 a printed circuit board, 11a an LSI, 11b on-chip components, 12 a dropping pipet, 13 a printed circuit board, 14 solder, 15 a taper, 16 incident lights, 17 an optical axis, 18 a bottom of a three-dimensional circuit board, 19 a side of a three-dimensional circuit board, 22 a pattern, and 23 a video amplifier circuit.

BEST MODE FOR CARRYING OUT THE INVENTION

Embodiments of the invention will be described referring to the drawings.

Embodiment 1

Figure 2:
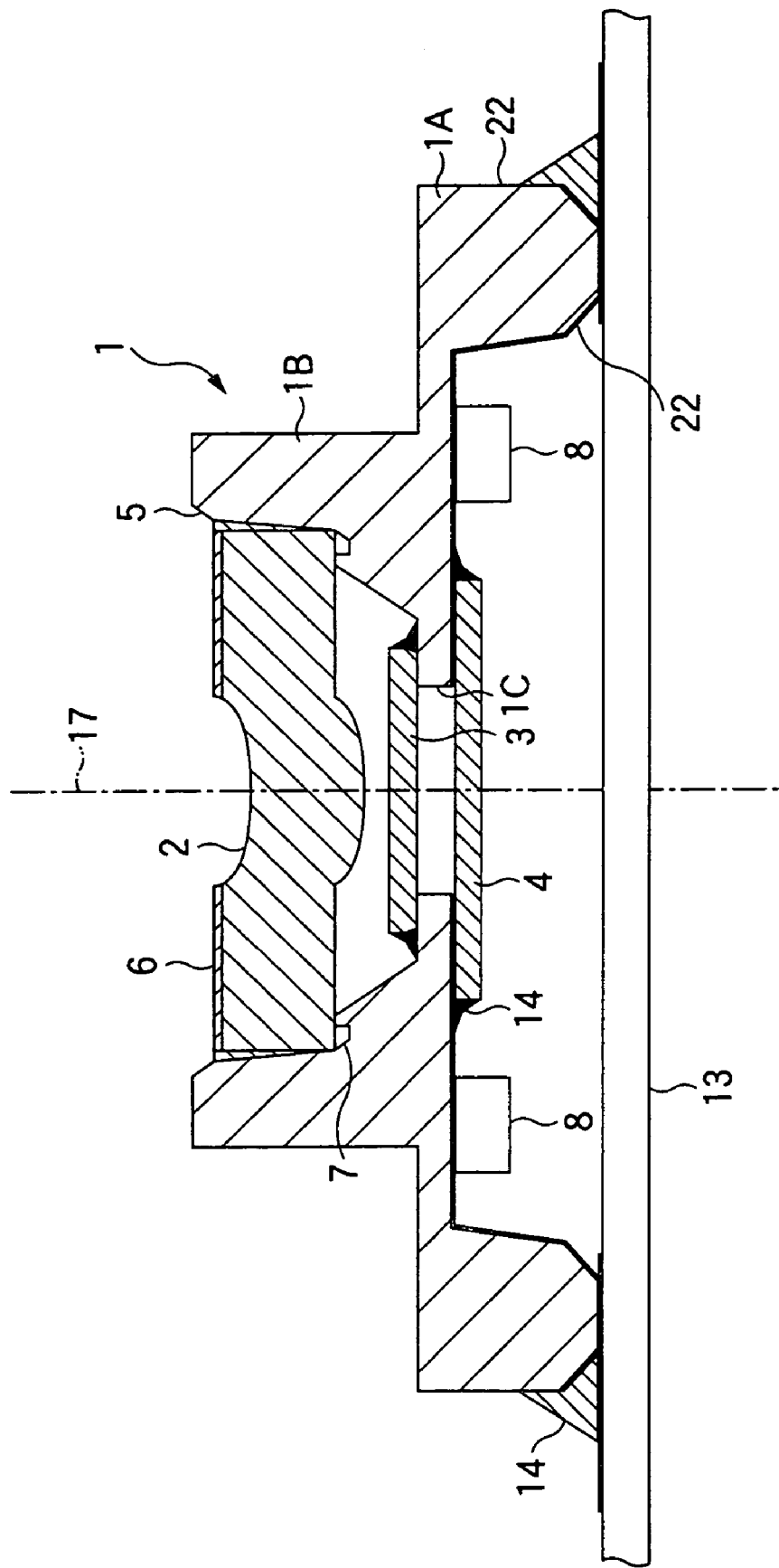
FIG. 2 is a sectional view of imaging apparatus in Embodiment 1 of the invention.

FIG. 1 is a perspective view showing the first embodiment of imaging apparatus according to the invention. FIG. 2 is a sectional view thereof. In FIGS. 1 and 2, a three-dimensional circuit board 1 is composed of a leg 1A having rectangular frustum shape and a barrel 1B thereon having the shape of a bottomed cylinder, and an opening 1C is formed at the boundary between the leg 1A and the barrel 1B and a wiring pattern 22 is formed on the back side of the leg 1A. Onto the inner circumference of the barrel 1B of the three-dimensional circuit board 1 is fit a lens 2, about whose optical axis 17 is arranged an optical filter 3 above the opening 1C, below which are arranged a semiconductor imaging device 4 and on-chip components 8. All of these components are completed when attached to a three-dimensional circuit board 1. Beneath the three-dimensional circuit board is arranged a printed circuit board 13 as a main circuit board of a portable telephone set, a PC or various sensors to which the three-dimensional circuit board 1 is attached.

Next, the assembly sequence of imaging apparatus in this embodiment will be briefly described. An optical filter 3 is fixed to the three-dimensional circuit board 1 from above, a lens 2 equipped with a lens mask 6 in advance on the surface is attached, then the lens 2 is fixed by injecting an adhesive from bonding points (adhesive injection grooves) 5 formed on the inner periphery of the barrel 1. An excess volume of the injected adhesive is stored in the adhesive reservoir 7 below the injection point 5. Next, from beneath the three-dimensional circuit board 1, a semiconductor imaging device 4, an LSI or on-chip components 8 such as a resistor and a capacitor are electrically connected to a pattern 22 by way of soldering 14, a conductive adhesive, or ultrasound joint, etc. and a leg 1A is electrically connected to the pattern of a printed circuit board 13 via the pattern 22 by way of soldering, a conductive adhesive, or ultrasound joint, etc.

In this way, according to Embodiment 1 of the invention, it is possible to provide a compact, lightweight and rigid structure by arranging the lens 2 on the three-dimensional circuit board 1 and arranging the optical filter 3 and the semiconductor imaging device 4 on the optical axis 17 of the lens 2, and by integrally fixing the on-chip components 8 to the pattern 22 of the three-dimensional printed circuit board 1. This approach allows assembly by an automatic machine and is fit for mass production. Further, by mounting the on-chip components 8 on the three-dimensional printed circuit board 1 to perform driving of the semiconductor imaging device 4 and de-coupling of circuits, it is possible to do without a lead wire of a length corresponding to wiring to the drive circuit for the semiconductor imaging device 4 and components mounted on the circuit board thus providing a simple structure, thereby reducing a round waveform of a clock signal flowing in the lead wire as well as reducing unwanted radiation byway of de-coupling of circuits.

Embodiment 2

Figure 3:
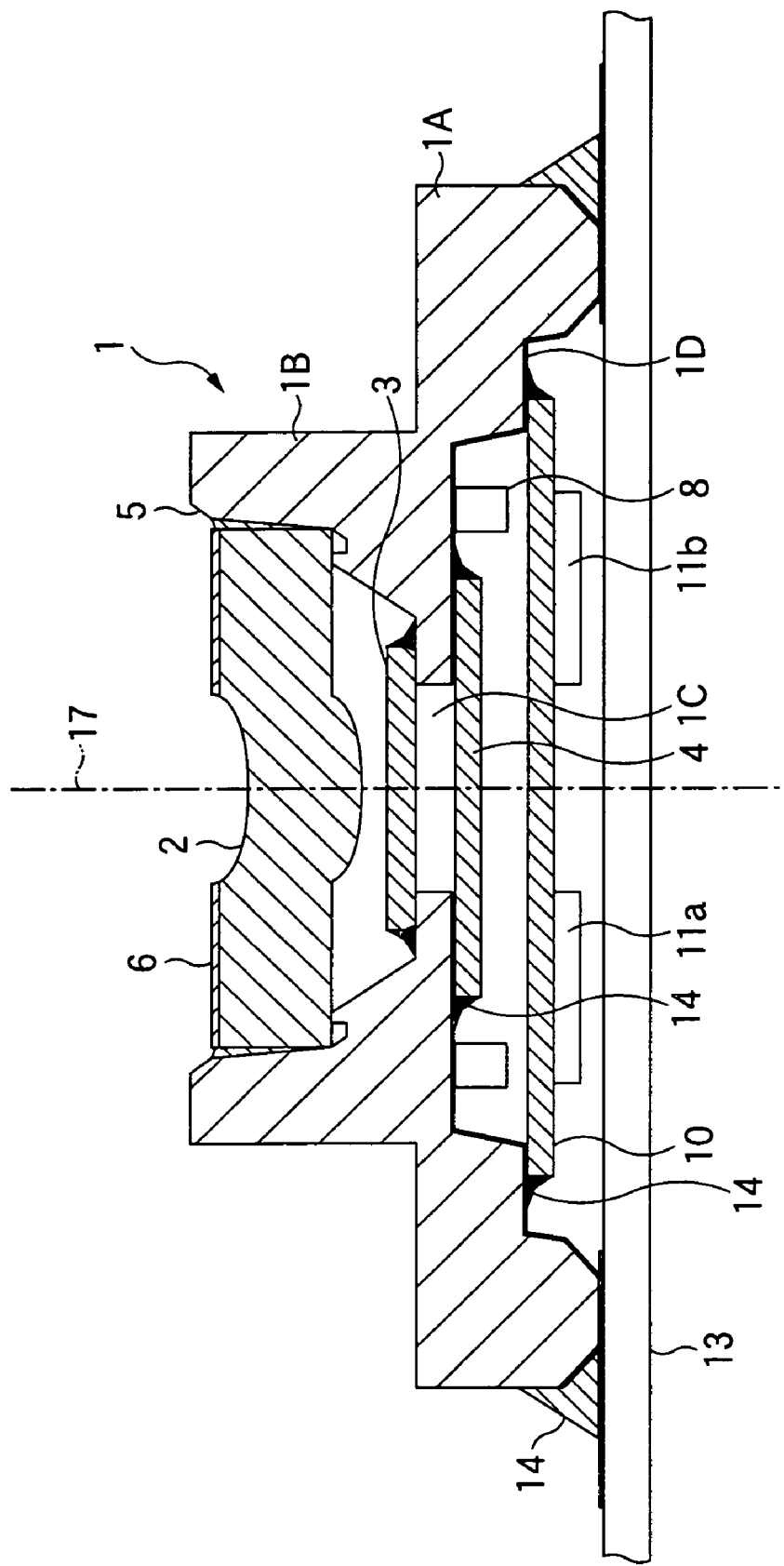
FIG. 3 is a sectional view of imaging apparatus in Embodiment 2 of the invention.

FIG. 3 is a sectional view of imaging apparatus in Embodiment 2 of the invention. For simplicity, similar members to those in Embodiment 1 are assigned the similar signs. In FIG. 3, a three-dimensional printed circuit board 1 is composed of a leg 1A having a rectangular frustum shape and a barrel 1B thereon having the shape of a bottomed cylinder, and an opening 1C is formed at the boundary between the leg 1A and the barrel 1B and a recessed shoulder 1D is formed inside the leg 1A. On the back-side of the leg 1A including the recessed shoulder 1D is formed a wiring pattern 22. Onto the inner circumference of the barrel 1B of the three-dimensional circuit board 1 is fit a lens 2, about whose optical axis 17 is arranged an optical filter above the opening 1C, below which are arranged a semiconductor imaging device 4 and on-chip components 8. On the recessed shoulder 1D beneath is arranged a printed circuit board 10 mounting an LSI 11a and on-chip components 11b on one surface or both surfaces, and finally a printed circuit board of a portable telephone set, etc. is arranged.

Next, the assembly sequence of imaging apparatus Embodiment 2 will be briefly described. An optical filter 3 is fixed to the three-dimensional circuit board 1 from above, a lens 2 equipped with a lens mask 6 in advance on the surface is attached, then the lens 2 is fixed by injecting an adhesive from bonding points 5 formed on the inner periphery of the barrel 1B. An excess volume of the injected adhesive is stored in the adhesive reservoir 7 below the injection point 5. Next, from beneath the three-dimensional circuit board 1, a semiconductor imaging device 4, an LSI or on-chip components 8 such as a resistor and a capacitor are electrically connected to a pattern 22 by way of soldering 14, a conductive adhesive, or ultrasound joint, etc., a printed circuit board 10 is electrically connected to the pattern 22 of the recessed shoulder 1D by way of soldering 14, and finally a leg 1A is electrically connected to the pattern of a printed circuit board 13 via the pattern 22 by way of soldering, a conductive adhesive, or ultrasound joint, etc.

In this way, according to Embodiment 2 of the invention, it is possible to add further features to the imaging apparatus on top of the advantages of Embodiment 1 by arranging the lens 2 on the three-dimensional circuit board 1 and arranging the optical filter 3 and the semiconductor imaging device 4 on the optical axis 17 of the lens 2, and by integrally fixing the printed circuit board 10 mounting the LSI 11a and on-chip components 8 to the pattern 22 of the three-dimensional circuit board 1.

Figure 4:
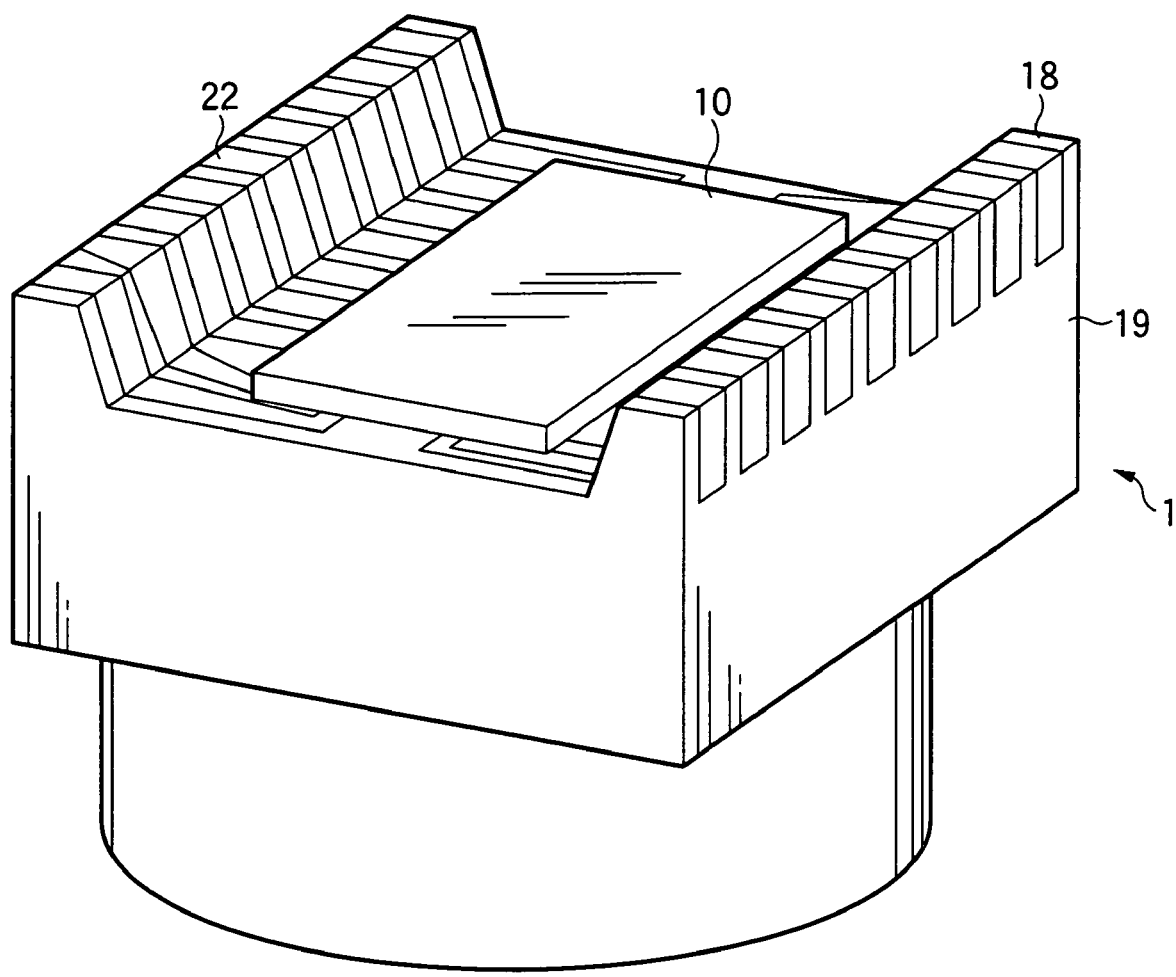
FIG. 4 is a perspective view of the bottom of a three-dimensional circuit board in the embodiments of the invention.

Next, description common to the aforementioned Embodiment 1 and Embodiment 2 will be given. FIG. 4 shows the bottom of the three-dimensional circuit board 1. In order to electrically connect imaging apparatus where components are attached by way of joint and electrical connection from above and from beneath the three-dimensional circuit board 1 to the printed circuit board 13 for applications such as a portable telephone set, a PC, etc., the pattern 22 where the semiconductor imaging device 4, the printed circuit board 10 are electrically connected is formed by way of printing or bonding along a bottom 18 of the three-dimensional circuit board 1 and so as to reach a side 19 of the three-dimensional circuit board. Via the pattern 22 the bottom 18 of the three-dimensional circuit board is arranged on the printed circuit board 13 for the application and electrically joined with the printed circuit board 13 by way of soldering 14, a conductive adhesive, or ultrasound joint, etc., and a video signal converted to an electric signal by the semiconductor imaging device is output to the main body of the application.

Figure 5:
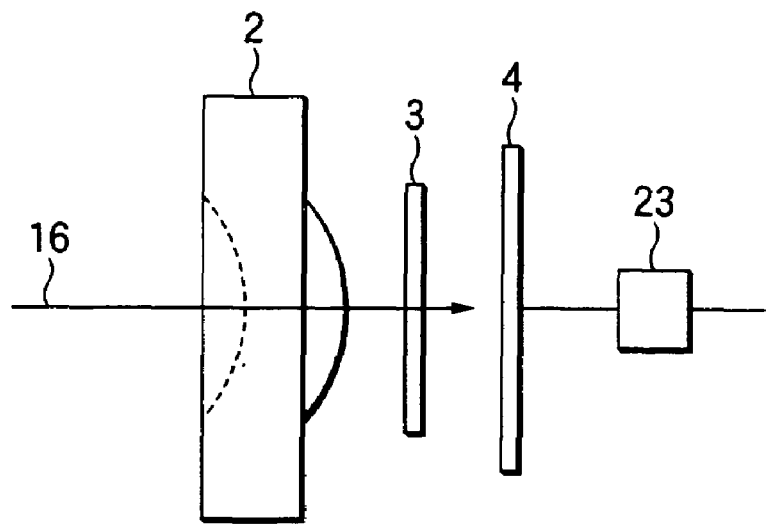
FIG. 5 is a schematic view of an optical system in the embodiments of the invention.
Figure 6:
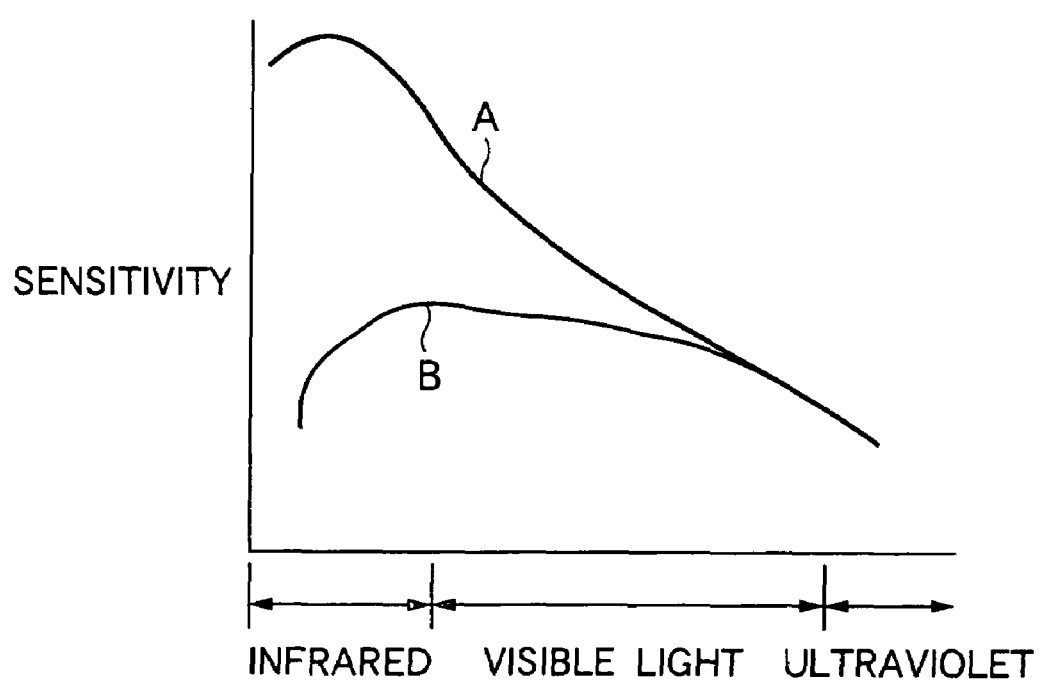
FIG. 6 is a characteristic diagram showing the sensitivity characteristic of a semiconductor imaging device in the embodiments of the invention.
Figure 7:
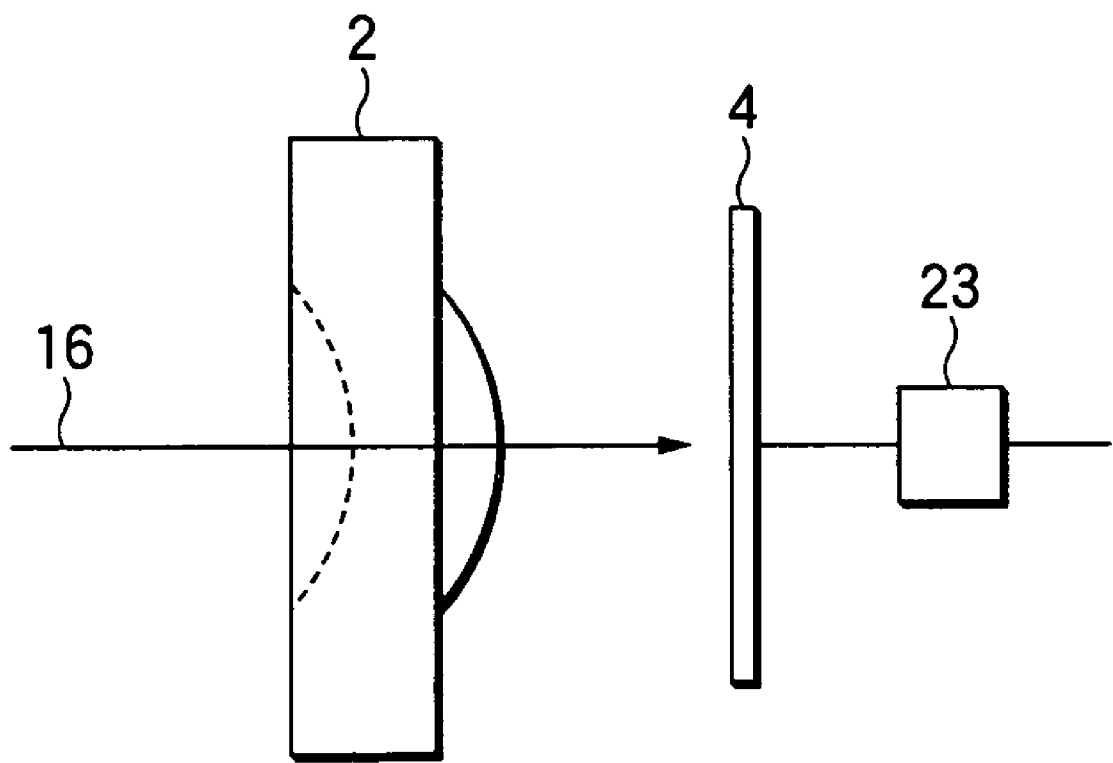
FIG. 7 is a schematic view of another optical system in the embodiments of the invention.

FIG. 5 shows an optical system in the aforementioned embodiments. Incident lights 16 are condensed by a lens 2, passes through an optical filter 3 that suppresses the sensitivity in the infrared spectrum, and impinges on the semiconductor imaging device 4. A CCD as a representative semiconductor imaging device 4 shows a flat sensitivity characteristic in the visible light region as the characteristic B obtained by passing through the optical filter 3, amplified by a video amplifier circuit 23 and corresponds to a color picture as a video signal of a flat characteristic. In the CCD sensitivity characteristic shown in FIG. 6, the characteristic A without the optical filter 3 shows an extremely high sensitivity in the infrared region so that the imaging apparatus can be used for imaging pictures in a dark place or as an infrared sensor by utilizing the sensitivity in the infrared region when imaging an object in a dark place. Thus, as shown in FIG. 7, by removing the filter 3 for suppressing the sensitivity in the infrared region and configuring the imaging apparatus by the lens 2 and the semiconductor imaging device 4, it is possible to use the imaging apparatus as high-sensitivity imaging apparatus or an infrared sensor thus enhancing the application range of the imaging apparatus.

Figure 8:
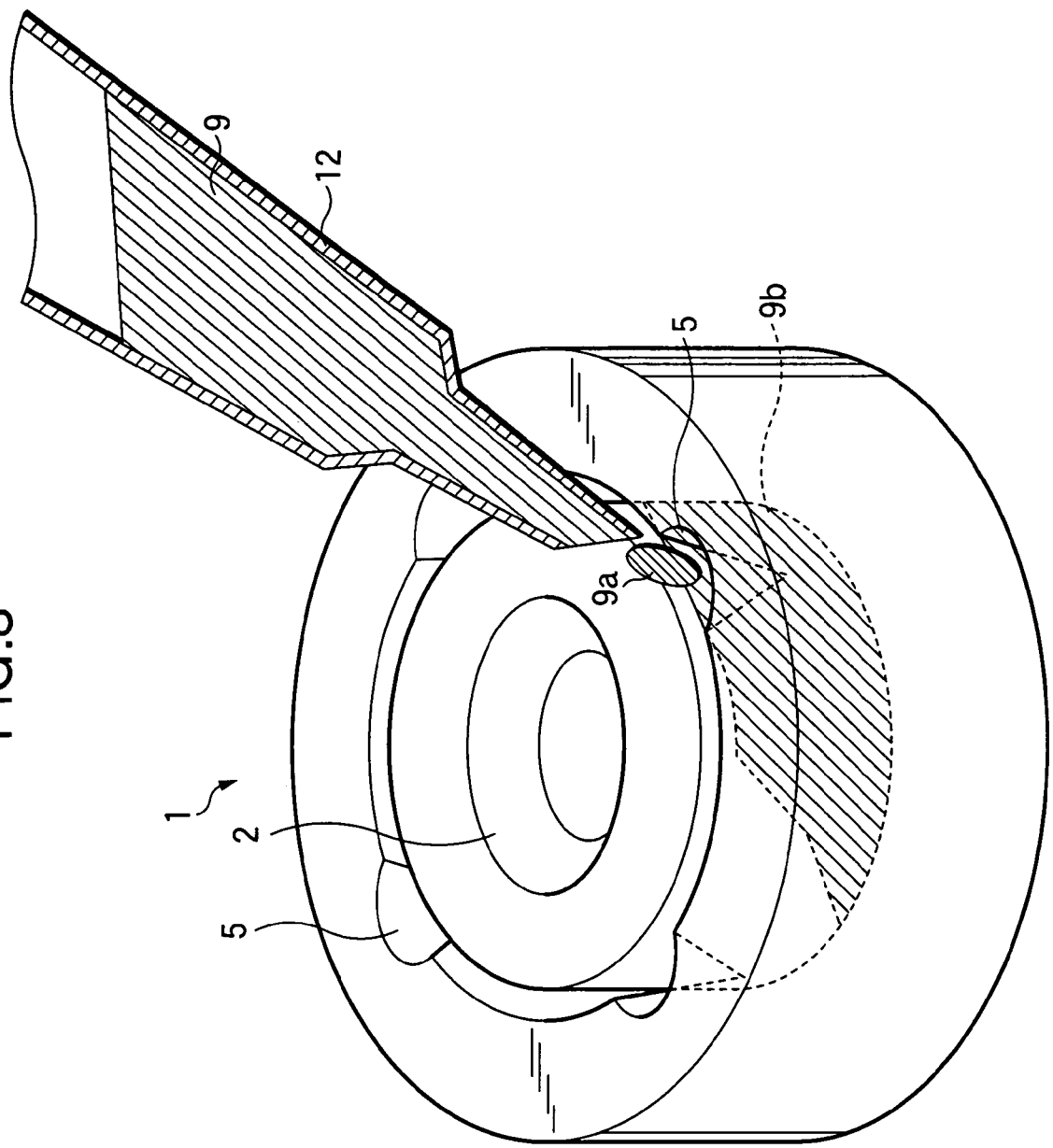
FIG. 8 is a perspective view of imaging apparatus showing the adhesive injecting method in the embodiments of the invention.

FIG. 8 shows a method for fixing by bonding a lens 2 with a three-dimensional circuit board 1 in the embodiments. The structure shown comprises four bonding points (adhesive injection grooves) 5 inside the location where the lens 2 of the three-dimensional circuit board 1 is inserted thus facilitating the bonding work. The number of bonding points 5 is increased/decreased depending on the viscosity of the adhesive 9. When the adhesive 9 is less viscous, the number of bonding points 5 is decreased and the adhesive 9 is injected in the form of instillation 9a, which forms adhesive spread 9b to bond the lens 2 with the three-dimensional circuit board 1. When the adhesive 9 is more viscous, an appropriate volume of the adhesive 9 is injected in the form of instillation 9a from a plurality of bonding points 5. This structure is fit for effectively performing the instillation 9a from the dropping pipet 12 when imaging apparatus is successively produced using an automatic machine.

Figure 9:
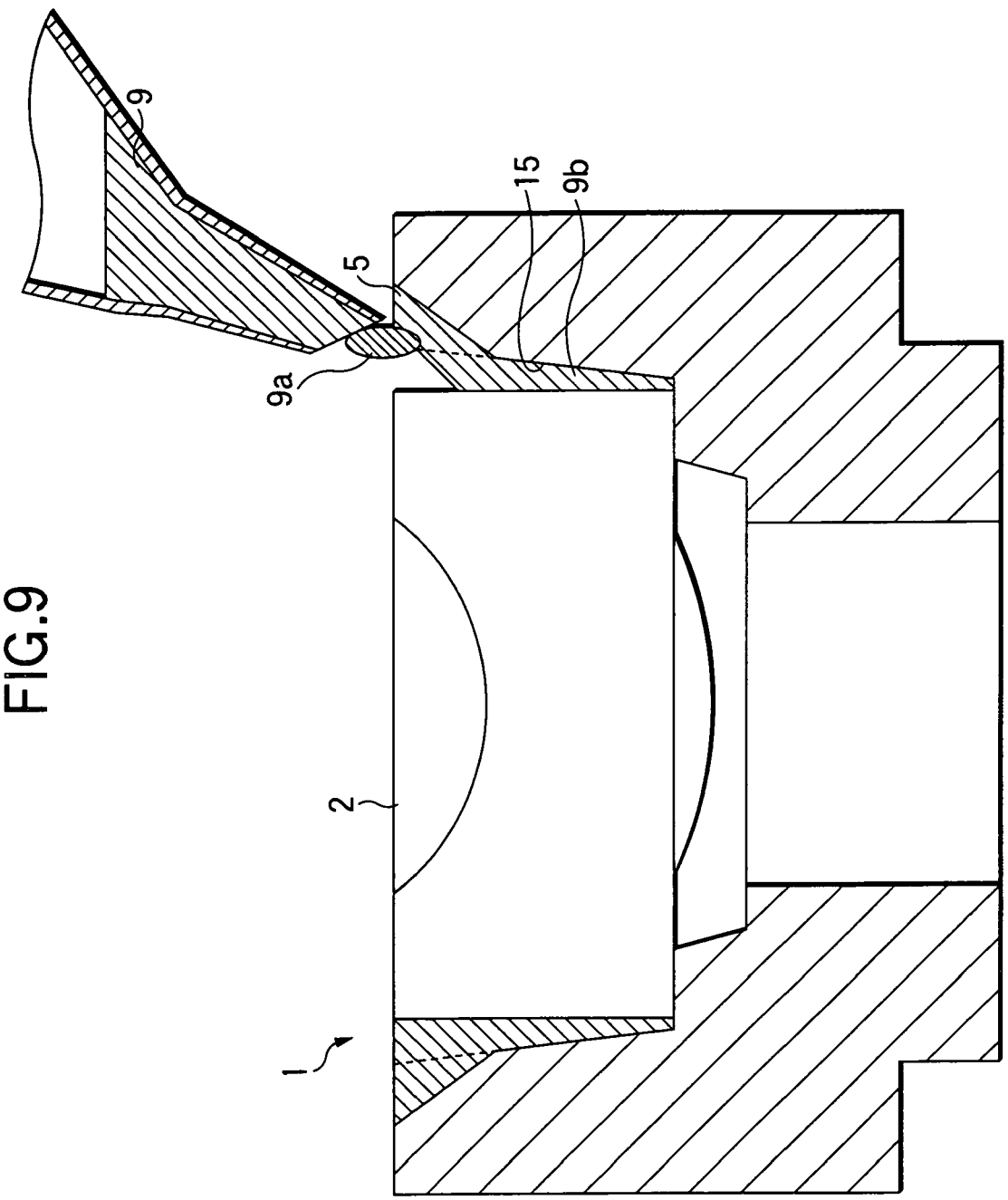
FIG. 9 is a sectional view of imaging apparatus showing the adhesive injecting method in the embodiments of the invention.

FIG. 9 shows a structure where the inner periphery of the three-dimensional circuit board 1 is a taper 15 so that the adhesive 9 may permeate into the boundary between the lens 2 and the three-dimensional circuit board 1 when the lens 2 is bonded with the three-dimensional circuit board 1. By doing this, the instillation 9a injected from bonding points 5 in successive production of imaging apparatus flows along the taper 15 to form the adhesive spread 9b and is applied uniformly in the peripheral of the lens 2. The taper 15 can be used to give a margin to the insertion of an automatic machine when the lens 2 is attached in place from above, in successive production of imaging apparatus. In other words, it is possible to insert the lens 2 from above with good margin while following the taper.

Figure 10:
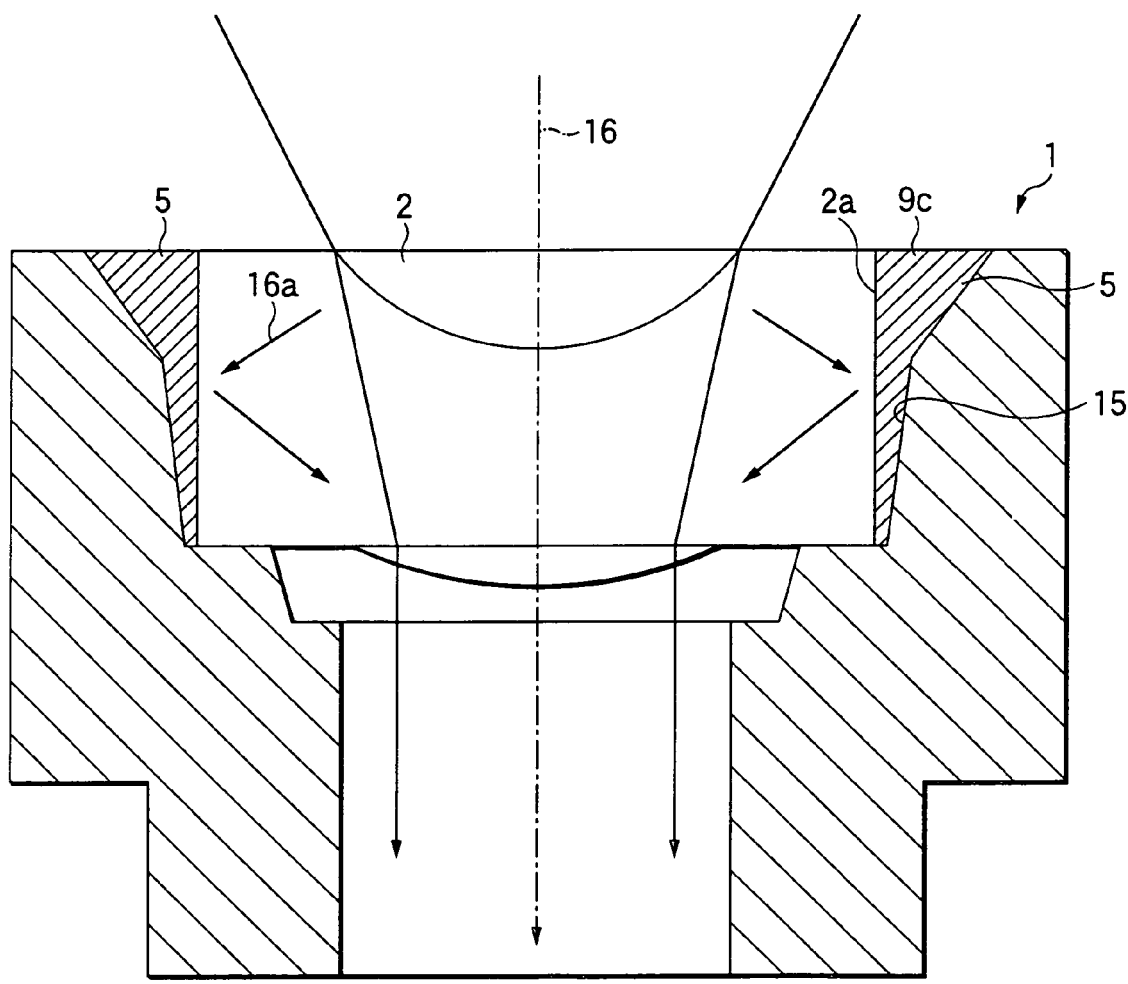
FIG. 10 is a sectional view of imaging apparatus showing the irregular reflection prevention method in the embodiments of the invention.

FIG. 10 shows a structure where the adverse effects on a picture caused by irregular reflection are minimized. When incident lights 16 are impinged and condensed by the lens 2 and focused on the semiconductor imaging device 4, an irregularly reflected light 16a caused by dust on the surface of the lens 2 or irregularity of lights inside the lens 2 impinges on a lens side 2a and reflects thereon, which may interfere with the incident lights 16 or reach the semiconductor imaging device 4 thus causing distortion or disturbances in a picture. In order to prevent this, a dark (black) colored adhesive 9 is used for bonding on the outer surface of the lens 2 thus suppressing reflection of light on the lens side 2a. This allows an optical signal to suppress reflection of irregularly reflected light 16a to be output from the lens side 2a to the semiconductor imaging device 4.

Figure 11:
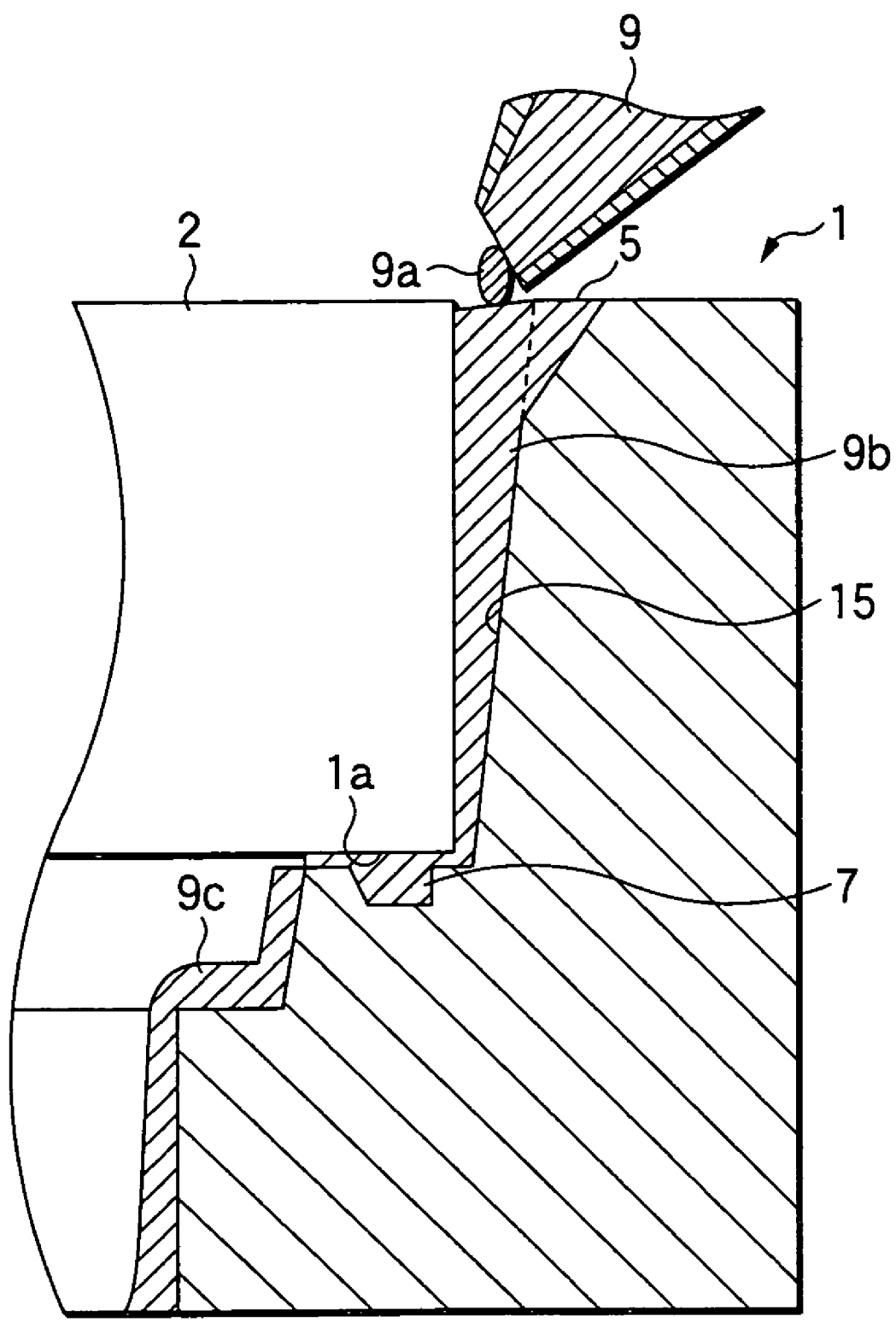
FIG. 11 is a partial sectional view of imaging apparatus showing the adhesive seeping prevention method in the embodiments of the invention.

FIG. 11 shows a structure that prevents seeping of an excess volume of the adhesive 9 through the inside of the three-dimensional circuit board. In case the volume of the instillation 9a is excessive when the lens 2 is bonded with the three-dimensional circuit board 1 with an adhesive, the adhesive 9a drops inside the three-dimensional circuit board 1 thus forming seeping 9c from the lens contact surface 1a thus contaminating the inside. In order to prevent this, an adhesive reservoir 7 is provided in the lower area of the inner periphery of the barrel of the three-dimensional circuit board 1.

Figure 12:
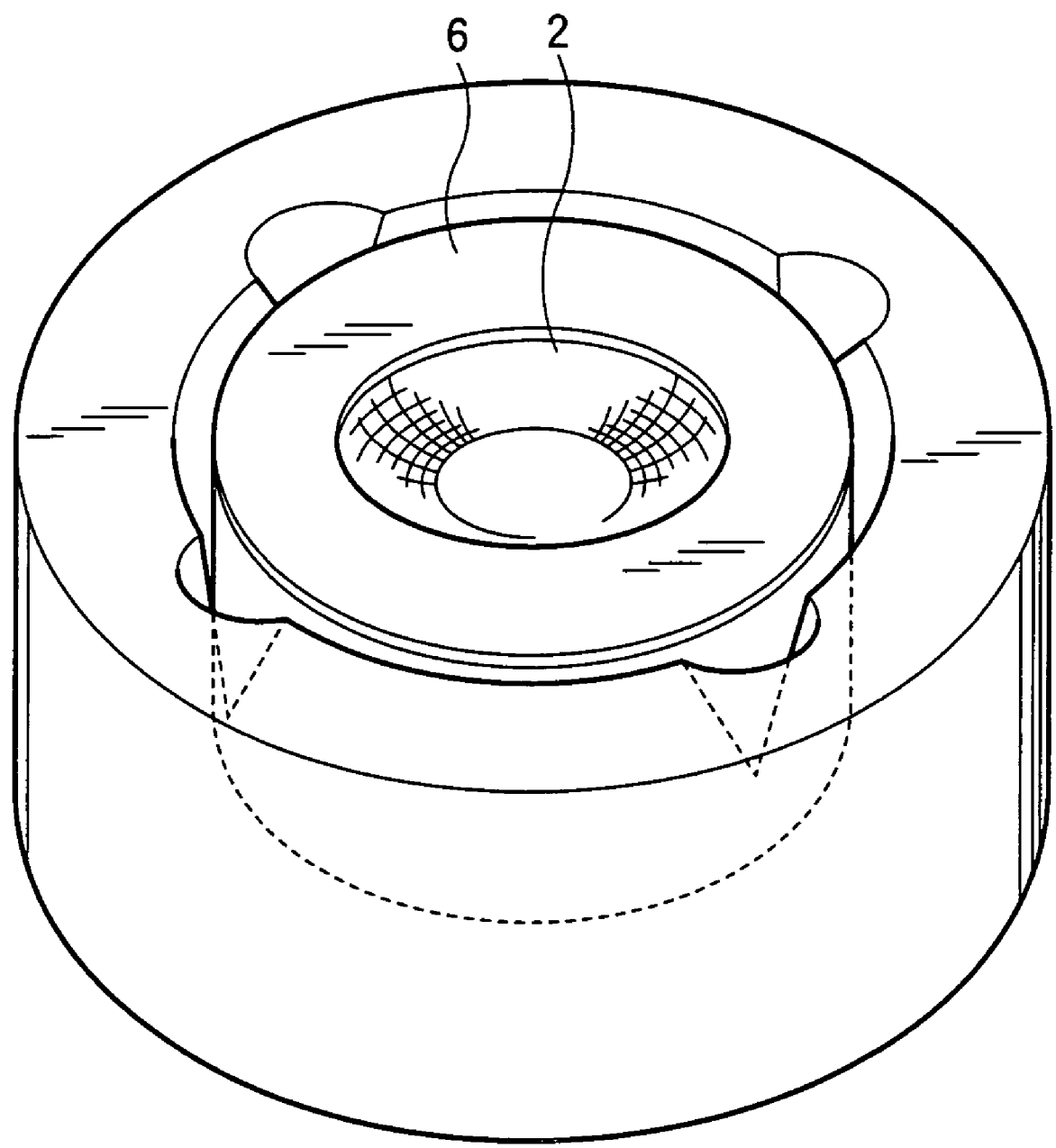
FIG. 12 is a perspective view of imaging apparatus showing the lens mask in the embodiments of the invention.
Figure 13:
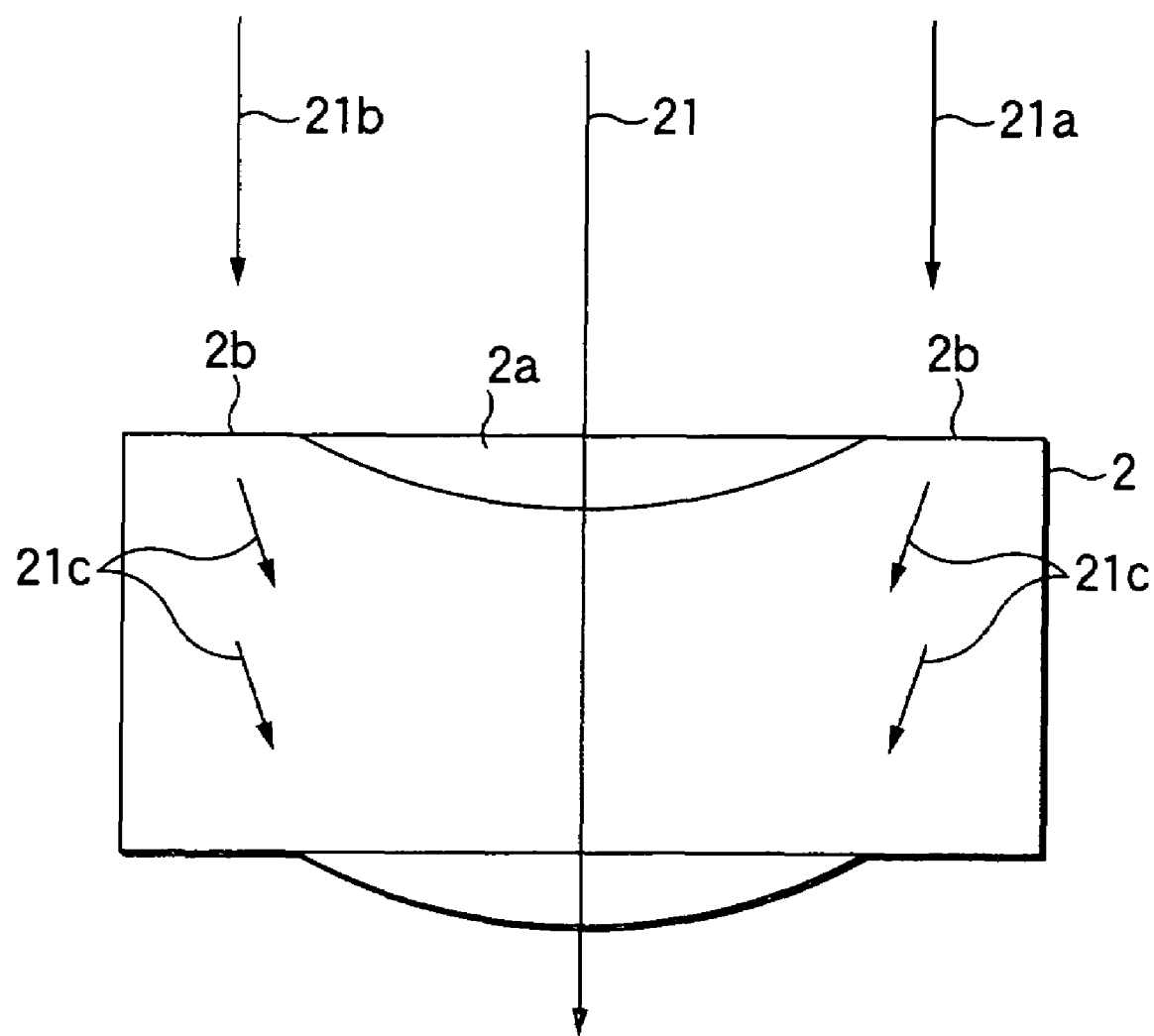
FIG. 13 is front view of a lens equipped with a lens mask in the embodiments of the invention.
Figure 14:
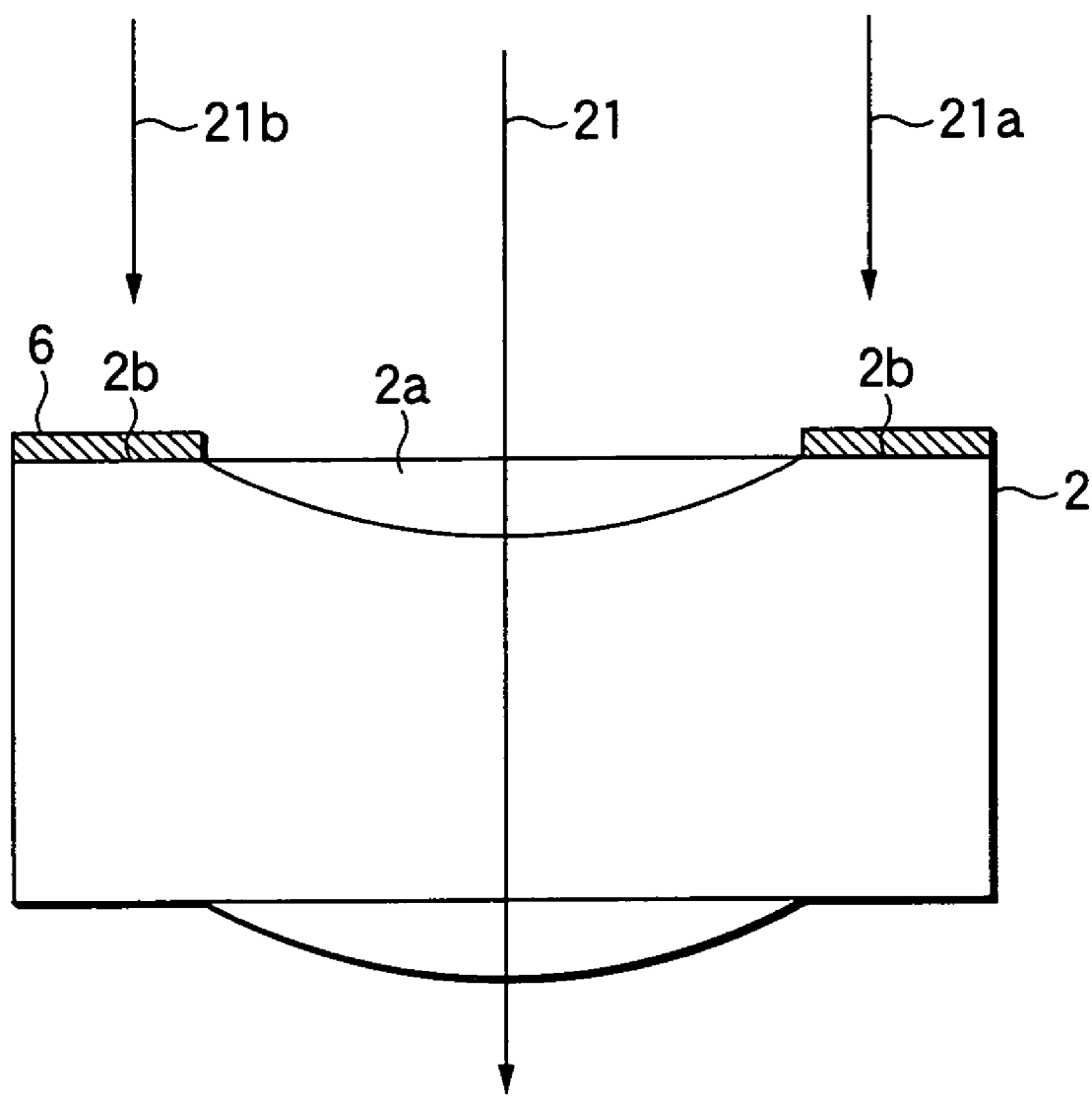
FIG. 14 is front view of a lens without a lens mask in the embodiments of the invention.

FIG. 12 is a structure where the adverse effects on a picture caused by lights impinging on the sections other than the effective lens section are minimized. The lens 2 is more lightweight than a glass lens and is often manufactured by way of resin molding in order to adjust the refractive index as an aspheric lens. In the case of a resin-molded lens, as shown in FIG. 13, when incident lights 21a, 21b impinge on a plane 2b separate from the effective lens section, the lights that impinged enter the lens due to irregular reflection on the lens surface, such as an irregularly reflected light 21c, thus interfering with the incident lights 21 or reaching the semiconductor imaging device 4, which may distort the picture or degrade the picture quality otherwise. In order to prevent this, as shown in FIG. 14, the structure is equipped with a lens mask 6 by way of a black system coating or metal material onto the plane 2b, so that lights may not impinge from the plane 2b separate from the effective lens section 2a of the lens 2.

In this way, it is possible to commercialize imaging apparatus at a high level by way of particular assembly of the lens 2, optical filter 3, semiconductor imaging device 4, printed circuit boards 10, 13 with the three-dimensional circuit board 1. It is also possible to provide a structure where electric connection with a printer circuit board for an application using direct connection without connectors, etc. Another structure is possible where the printed wiring pattern 22 provided on the bottom and sides of the three-dimensional circuit board 1 is used to insert the three-dimensional circuit board into connectors provided on a printer circuit board for an application thus providing electric connection.

INDUSTRIAL APPLICABILITY

As described hereinbefore, the invention has a structure where a three-dimensional circuit board is provided having a wiring pattern for connecting a semiconductor imaging device and on-chip components, and a lens, as well as an optical filter and the semiconductor imaging device arranged on the optical axis of the lens are integrally incorporated on the three-dimensional circuit board. It is possible to provide a compact, lightweight and rigid imaging apparatus where all the components necessary for imaging apparatus are integrated on the three-dimensional circuit board, as well as implement an assembling method that allows automatic mounting of components and excellent in terms of mass production.

The invention claimed is:

1. Imaging apparatus comprising:
   a semiconductor imaging device on a surface of the imaging apparatus; and
   a three-dimensional circuit board above said semiconductor imaging device, characterized in that said three-dimensional circuit board comprises a recessed shoulder where a wiring pattern is formed inside a leg and that on said recessed shoulder is arranged a printed circuit board with an LSI and on-chip components joined on one surface or both surfaces of said printed circuit board.

2. The imaging apparatus of claim 1, wherein the three-dimensional circuit board forms a barrel for receiving a lens.

3. The imaging apparatus of claim 1, wherein the three-dimensional circuit board includes a cylindrical barrel provided on the leg;
   and the imaging apparatus further includes
   a lens, supported inside said barrel, to impinge a light onto said semiconductor imaging device.

4. Imaging apparatus according to claim 3, characterized in that the sections other than the effective section of the lens on the front of the lens are masked.

5. Imaging apparatus according to claim 3, characterized in that the imaging apparatus lacks an optical filter.

6. Imaging apparatus according to claim 1, characterized in that said three-dimensional circuit board includes:
   a barrel connected to said leg; and
   an opening formed at the boundary between said barrel and the leg,
   wherein an optical filter is arranged above said opening, and wherein said semiconductor imaging device and on-chip components are arranged below said opening, and
   wherein the barrel has a bottomed cylinder shape.

7. Imaging apparatus according to claim 6, characterized in that said three-dimensional circuit board has a wiring pattern for directly providing an electric connection between said three-dimensional circuit board and another printed circuit board on the bottom of said leg.

8. Imaging apparatus according to claim 7, characterized in that said three-dimensional circuit board has a plurality of adhesive injection grooves for injecting an adhesive on the upper area of the inner circumference of said barrel.

9. Imaging apparatus comprising:
   a semiconductor imaging device on a surface of the imaging apparatus; and
   a three-dimensional circuit board above said semiconductor imaging device including
   a barrel of a bottomed cylinder shape supporting said lens;
   a leg connected to said barrel, inside of which is formed a wiring pattern; and
   an opening formed at the boundary between said barrel and the leg,
   wherein an optical filter is arranged above said opening,
   wherein said semiconductor imaging device and on-chip components are arranged below said opening,
   wherein the three-dimensional circuit board has a wiring pattern for directly providing an electric connection between said three-dimensional circuit board and another printed circuit board on the bottom of said leg,
   wherein the three-dimensional circuit board has a plurality of adhesive injection grooves for injecting an adhesive on the upper area of the inner circumference of said barrel, and
   wherein the inner circumference of said barrel of said three-dimensional circuit board is formed while tapering downward adjacent to said adhesive injection grooves.

10. Imaging apparatus according to claim 8 or 9, characterized in that said adhesive is black.

11. Imaging apparatus comprising:
    a semiconductor imaging device on a surface of the imaging apparatus; and
    a three-dimensional printed circuit board above said semiconductor imaging device, wherein the three-deminsional printed circuit board forms a barrel for receiving a lens;
    characterized in that said three-dimensional printed circuit board includes:
    a leg connected to said barrel, inside of which is formed a wiring pattern; and
    an opening formed at the boundary between said barrel and the leg,
    wherein an optical filter is arranged above said opening, and wherein said semiconductor imaging device and on-chip components are arranged below said opening,
    wherein the barrel has a bottomed cylinder shape, and
    wherein said three-dimensional printed circuit board has a wiring pattern for directly providing an electric connection between said three-dimensional circuit board and another printed circuit board on the bottom of said leg and said three-dimensional printed circuit board has a plurality of adhesive injection grooves for injecting an adhesive on the upper area of the inner circumference of said barrel,
    characterized in that in the lower area of said barrel is provided an adhesive reservoir.

12. An imaging apparatus assembling method characterized in that, with respect to a three-dimensional circuit board having a barrel of a bottomed cylinder shape, a leg connected to said barrel, inside of which is formed a wiring pattern and an opening formed at the boundary between said barrel and the leg, said method comprises a step of joining a lens with the inner circumference of said barrel, a step of joining a semiconductor imaging device with said wiring pattern so as to block said opening from the back of said leg, a step of joining on-chip components with said wiring pattern, and a step of joining with a recessed shoulder a printed circuit board with an LSI and on-chip components joined in advance on one surface or both surfaces.

13. An imaging apparatus assembling method characterized in that, with respect to a three-dimensional circuit board having a barrel of a bottomed cylinder shape, a leg connected to said barrel, inside of which is formed a wiring pattern and an opening formed at the boundary between said barrel and the leg, said method comprises a step of joining an optical filter so as to block said opening from said barrel side, a step of joining a lens with the inner circumference of said barrel, a step of joining a semiconductor imaging device with said wiring pattern so as to block said opening from the back of said leg, a step of joining onchip components with said wiring pattern, and a step of joining with a recessed shoulder a printed circuit board with an LSI and on-chip components joined in advance on one surface or both surfaces.

14. An imaging apparatus assembling method according to claims 12 or 13 characterized in that said method comprises a step of joining an assembled three-dimensional circuit board to another circuit board via a wiring pattern formed on the bottom of the leg.

15. Imaging apparatus comprising:
a three-dimensional circuit board having a leg and a cylindrical barrel provided on the leg;
a semiconductor imaging device attached on back of said leg; and
a lens, supported inside said barrel, to impinge a light onto said semiconductor imaging device, wherein the three-dimensional circuit board comprises a recessed shoulder where a wiring pattern is formed inside said leg and that on said recessed shoulder is arranged a printed circuit board with an LSI and on-chip components joined on one surface or both surfaces of said printed circuit board.

16. Imaging apparatus comprising:
a three-dimensional circuit board having a leg and a cylindrical barrel provided on the leg;
a semiconductor imaging device attached to said three-dimensional circuit board behind the leg; and
a lens, supported inside said barrel, to impinge a light onto said semiconductor imaging device,
wherein said three-dimensional circuit board has a plurality of adhesive injection grooves for receiving an adhesive on an upper area of the inner circumference of said barrel, and
wherein the inner circumference of the barrel is formed while tapering downward adjacent to the adhesive injection grooves.

17. An imaging apparatus according to claim 16, wherein a lower area of the barrel includes an adhesive reservoir.

* * * * *